United States Patent [19]
Nishimoto

[11] Patent Number: 5,558,946
[45] Date of Patent: *Sep. 24, 1996

[54] MULTILAYERED THIN FERROELECTRIC FILM

[75] Inventor: Keiichi Nishimoto, Kanagawa, Japan

[73] Assignee: Fuji Xerox Co., Ltd., Tokyo, Japan

[*] Notice: The term of this patent shall not extend beyond the expiration date of Pat. No 5,525,434.

[21] Appl. No.: 130,882

[22] Filed: Oct. 4, 1993

[30] Foreign Application Priority Data

Oct. 5, 1992 [JP] Japan .................................. 4-288152

[51] Int. Cl.$^6$ ................................ G11B 5/66; B32B 9/00
[52] U.S. Cl. ............. 428/692; 428/694 R; 428/694 XS; 428/694 MM; 428/694 T; 428/694 GT; 428/694 TM; 428/694 TR; 428/900
[58] Field of Search ................................ 428/694 R, 692, 428/694 XS, 694 GT, 694 MM, 694 T, 694 TM, 694 TR, 900

[56] References Cited

FOREIGN PATENT DOCUMENTS 62-27482  6/1987  Japan .

OTHER PUBLICATIONS

Nashimoto et al., Material letters, 10(7,8): 348–354 (1981).
Mantese et al., "Metalorganic Deposition (MOD): A Non-vacuum, Spin–On, Liquid–Based, Thin Film Method," MRS Bulletin/October 1989, pp. 48–53.

Nicolas J. Phillips et al., "Sol–gel–derived lead titanate films", Journal of Non–Crystalline Solids, 147 & 148 (1992) 258–290.

I. Strawbridge et al., "The Factors Affecting the Thickness of Sol–Gel Dervied Silica Coatings Prepared by Dipping," Journal of Non–Crystalline Solids 86 (1986), pp. 381–393, Amsterdam.

"Epitaxial LiNbO$_3$ thin films prepared by a sol–gel process", Keiichi Nashimoto et. al., Materials Letters, 10(7,8):348–354 (1991).

Primary Examiner—Leszek Kiliman
Attorney, Agent, or Firm—Finnegan, Henderson, Farabow, Garrett & Dunner, L.L.P.

[57] ABSTRACT

The improved multilayered thin ferroelectric film includes a substrate, a first polycrystalline ferroelectric layer that is formed on the substrate, that has high density and a refractive index of the single-crystal grade but whose surface is not optically smooth, and a second polycrystalline ferroelectric layer that is formed on the first polycrystalline ferroelectric layer, that has a comparatively low density, that has a lower refractive index than the single crystal but which has an optically smooth surface.

4 Claims, 1 Drawing Sheet

MULTILAYERED THIN FERROELECTRIC FILM

BACKGROUND OF THE INVENTION

This invention relates to thin ferroelectric films that are applicable to the manufacture of electrooptic devices, non-volatile memory devices and the like since their surfaces are optically smooth and transparent and are free from pinholes. The invention also relates to a process for producing such thin ferroelectric films by making use of the hydrolysis of organometallic compounds.

Because of the many properties exhibited by ferroelectrics such as ferroelectricity, piezoelectricity and electrooptic effect, thin ferroelectric films have many potential applications not only in nonvolatile memories but also in surface elastic wave devices, infrared-pyroelectric devices, acousto-optic devices, electro-optic devices, etc. In particular, the application of thin ferroelectric films to electrooptic devices such as second harmonic generation (SHG) devices and optical modulating devices that have a thin-film waveguide structure has as an essential requirement the preparation of single-crystal thin films in order to achieve lower optical loss and characteristics of the single-crystal grade. In accordance with the conventionally known methods of preparing single-crystal thin films, thin epitaxial films of ferroelectrics such as $BaTiO_3$, $PbTiO_3$, $Pb_{1-x}La_x(Zr_{1-y}Ti_y)_{1-x/4}O_3$ (PLZT), $LiNbO_3$, $KNbO_3$ and $Bi_4Ti_3O_{12}$ are formed on single-crystal oxide substrates by deposition techniques including high-frequency magnetron sputtering, ion-beam sputtering, pulsed laser deposition and MOCVD. All of these techniques require very expensive equipment for implementation. In addition, they are unsatisfactory in terms of compositional control and the surface properties of thin films; furthermore, the crystal growth temperature must be comparatively high ($\geq 500°$ C.).

Examined Published Japanese Patent Application (kokoku) No. 27482/1987 teaches a process for producing thin ferroelectric films using organometallic compounds and it offers the following advantages: it achieves precise control over chemical composition; it insures uniformity at the molecular level; it can be implemented at lower temperatures; it can produce films of large area; and it can be implemented at low equipment cost.

In K. Nashimoto and M. J. Cima, "Epitaxial $LiNbO_3$ Thin Films Prepared by Sol-Gel Process" in Materials Letters, 10, 7, 8 (1991), 348, the present inventors reported that using yet to be hydrolyzed organometallic compounds, thin films of single-crystal ferroelectrics were grown epitaxially on single-crystal substrates whereas the polycrystalline growth of thin ferroelectric films occurred when using hydrolyzed organometallic compounds or when the substrate used had no epitaxial property with respect to the thin ferroelectric film to be grown.

The problem with the method described in Examined Published Japanese Patent Application (kokoku) No. 27482/1987, supra is that only thin polycrystalline films of low density could be produced even when firing was conducted at elevated temperatures. FIG. 2 is a simplified cross-sectional view showing diagrammatically a thin polycrystalline film 4 of low density that was formed on a substrate 1 by firing at elevated temperatures. Because of this low-density defect, the polarization-derived characteristics of the ferroelectric material cannot be utilized to the fullest extent; the thin film of interest causes so much scattering of light at crystal grain boundaries or by pinholes that it is not suitable for use as an optical waveguide or the like; the film is also unsuitable for use as a capacitor on account of great current leakage and small dielectric breakdown voltage due to crystal grain boundaries or pinholes.

The approach of preparing the epitaxial $LiNbO_3$ thin film by the process described in Materials Letters, ibid. later turned out that when using a substrate having no epitaxial property with respect to the thin film to be formed, the temperature for the crystallization of the thin film of a hydrolyzed organometallic compound was lower than in the case where the thin film was prepared from a yet to be hydrolyzed organometallic compound.

The single-crystal or polycrystalline thin ferroelectric film that was formed by firing at a temperature of about 400° C. had an optically smooth and transparent surface and the grain size of crystals was much smaller than the wavelength of light; however, due to the presence of fine pores with sizes on the order of nanometers, the thin film did not have a satisfactorily high density, nor did it have a refractive index of the single-crystal grade. The thin ferroelectric film that was formed by firing at a temperature of about 700° C. had high density and its refractive index was of the single-crystal grade; however, due to the growth of secondary crystal grains, the surface of the film was not optically smooth; in addition, the film had only low transparency since the grain size of crystals was close to the wavelength of light.

SUMMARY OF THE INVENTION

The present invention was accomplished under these circumstances and has as an object providing a multilayered thin ferroelectric film that has an optically smooth and transparent surface. Another object of the invention is to provide a process by which a multilayered thin ferroelectric film that has an optically smooth and transparent surface can be produced by making use of the hydrolysis of an organometallic compound.

The thin ferroelectric film produced in accordance with the present invention is polycrystalline since it is formed by hydrolysis of an organometallic compound on a substrate having no epitaxial property with respect to the film. However, the surface of the film is optically smooth and transparent and, hence, it is suitable for use as an electric device of a type that adopts an optical waveguide. In addition to the optical smoothness, the surface of the film has no pinholes and, hence, the current leakage in the film is small and the dielectric insulation breakdown voltage is high.

DETAILED DESCRIPTION OF THE PREFERRED EMBODIMENTS

The multilayered thin ferroelectric film of the present invention and the process for preparing it are described below in detail.

The organometallic compound to be used in the present invention is selected from among alkoxides or salts of metals including Li, K, Nb, Ta, Bi, Ba, Sr, Pb, La, Ti and Zr etc. These starting materials are so selected as to provide a desired formula and used as dissolved in a suitable solvent selected from among alcohols, diketones, ketonic acids, alkyl esters, oxyacids, oxyketones, etc. The solution may be subjected to hydrolysis before it is applied to the substrate or it may be first applied to the substrate and then hydrolyzed during firing. Alternatively, the two methods may be combined to effect hydrolysis.

The solution can be applied to the substrate by any suitable method that is selected from among spin coating, dip coating, spray coating, screen printing, ink-jet printing, etc. The substrate to be used has no epitaxial property with respect to the thin ferroelectric film to be formed (i.e., has no crystal lattice matching with the film) and may be selected from among metals, semiconductors, glass, ceramics, and single-crystal oxide such as sapphire, spinel, MgO and ZnO.

The coating as applied to the substrate is then fired at a temperature in a range of 400° to 1,000° C. to crystallize a thin ferroelectric film. The process of coating and firing steps may be performed more than once and repeated a predetermined number of times.

In the next step, a solution having either the same or different formula than the first solution is applied to the first layer of polycrystalline ferroelectric film and fired at a temperature in a range of 200° to 600° C. that is lower than the firing temperature used to form the first layer, whereby a second layer of polycrystalline ferroelectric film having a smooth surface is formed. Again, the process of coating and firing steps may be performed more than once and repeated a predetermined number of times. Each of the firing steps may be preceded by heating at a temperature in the range 100° to 400° C. that does not cause crystallization of the thin film.

Figure 1:
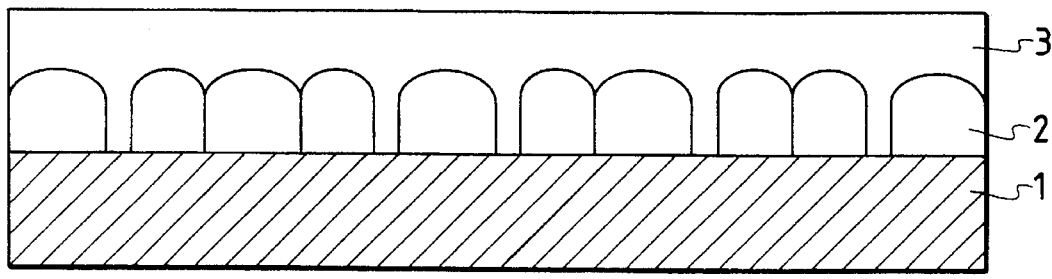
FIG. 1 is a simplified cross-sectional view showing diagrammatically the multilayered thin ferroelectric film of the present invention.
Figure 2:
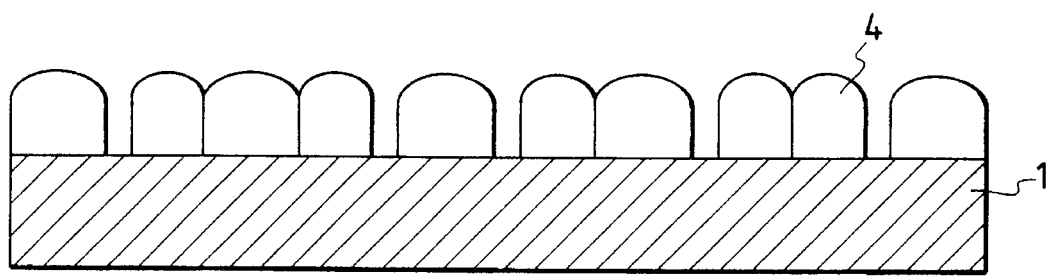
FIG. 2 is a simplified cross-sectional view showing diagrammatically a conventional thin polycrystalline film of low density that is prepared by firing at high temperature.

The above-described process permits a smooth-surfaced thin ferroelectric film to be formed on various kinds of substrates. If the polycrystalline ferroelectric in the thin ferroelectric film has a multilayered structure comprising a first and a second layer of polycrystalline ferroelectric film having the same formula, the first layer which has been formed by firing at the higher temperature has high density and refractive index but has a coarse crystal grain structure, whereas the second layer which has been formed by firing at the lower temperature has a comparatively low density and a low refractive index but has an optically smooth surface. The thin ferroelectric film having this multilayered structure is shown in FIG. 1, in which numeral 1 refers to the base, 2 designates the first layer of polycrystalline ferroelectric film having a coarse grain structure; and 3 denotes the second layer of polycrystalline ferroelectric film having an optically smooth surface.

If the multilayered structure comprising a first and a second layer of polycrystalline ferroelectric film having different formulae, the first layer which has been formed by firing at the higher temperature is high in both density and refractive index but it has a coarse crystal grain structure, whereas the second layer which has been formed by firing at the lower temperature has a comparatively low density but its refractive index is the same as that of the first layer to provide an optically smooth surface.

The following examples are provided for the purpose of further illustrating the present invention but are in no way to be taken as limiting.

EXAMPLE 1

Equimolar amounts of $LiOC_2H_5$ (99.9%) and $Nb(OC_2H_5)_5$ (99.999%) were dissolved in molecular sieve dehydrated ethanol to prepare a 0.05M solution. The solution was refluxed at 78.5° C. for 24 h under stirring to form a double alkoxide $Li[Nb(OC_2H_5)_6]$. The formation of this alkoxide having a structure precursory of $LiNbO_3$ is important for controlling the Li/Nb ratio to 1:1 and for insuring uniformity at the molecular level.

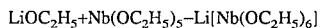

$$LiOC_2H_5+Nb(OC_2H_5)_5 \rightarrow Li[Nb(OC_2H_5)_6]$$

An ethanol solution containing 1 mol of $H_2O$ per Li atom was added dropwise to the alkoxide solution and partial hydrolysis of $Li[Nb(OC_2H_5)_6]$ was performed. Thereafter, the solution was concentrated under vacuum to a density of 0.5M. By subsequent filtration on a 0.1-μm filter, a precursor solution for spin coating was formed. All of the steps up to this stage were conducted in a $N_2$ atmosphere. The solution was concentrated and dried to a powder; thermogravimetric analysis (TGA) showed that upon partial hydrolysis, $Li[Nb(OC_2H_5)_6]$ had changed to $LiNb(OC_2H_5)_4O$. When hydrolysis was effected in an ethanol solution containing 3 moles of $H_2O$ per Li atom, $Li[Nb(OC_2H_5)_6]$ further changed to $LiNb(OH)(OC_2H_5)O_2$. The first solution that had been subjected to partial hydrolysis remained stable for a prolonged time but the second solution that had been subjected to hydrolysis was not suitable for practical use since it gelled within a few days.

As an increasing amount of $H_2O$ was added to the precursor solution, the film that was spin coated on a sapphire ($\alpha$-$Al_2O_3$) (001) substrate experienced a change in the structure of $LiNbO_3$ from the oriented to the polycrystalline state after firing at a temperature of 400° C. Both the polycrystalline and oriented films had an optically smooth surface after firing at 400° C. but when firing was done at a higher temperature, the density of either film decreased on account of the growth of crystal grains.

The precursor solution was spin coated on two substrates at 2,000 rpm in a $N_2$ atmosphere at room temperature; one substrate was made of silicon (100) having a 15×15 mm² $SiO_2$ layer and the other substrate was made of sapphire ($\alpha$-$Al_2O_3$) (001). Prior to spin coating, the Si substrate was only subjected to supersonic cleaning in acetone and rinse with deionized water; on the other hand, the sapphire substrate was subjected to supersonic cleaning in acetone, etching with 20 vol % HCl and rinse with deionized water. After these treatments, the substrates were dried at 120° C.

Following the spin coating, the substrates were heated in an $O_2$ atmosphere to 700° C. at a rate of 10° C./min; the $O_2$ atmosphere had been humidified by bubbling in deionized water at a rate of 2.0 L/min at room temperature. The substrates were then held at 700° C. for 60 min. The treatment of humidification with $O_2$ was effective for hydrolysis to be effected during the firing of the spin coated film. The process atmosphere was changed to dry $O_2$, in which the substrates were held for 30 min; thereafter, the power to the electric furnace was switched off to cool the substrates. Thus, a first layer of polycrystalline ferroelectric film having high density and a refractive index of the single-crystal grade was formed on each of the substrates.

In the next step, a solution for the second layer of polycrystalline ferroelectric film was applied by spin coating that was performed in the same manner as described above. The asperities in the surface of the first layer of polycrystalline ferroelectric film that were due to the coarse crystal grains formed by the growth of secondary crystal grains were leveled out by spin coating to produce a very smooth surface. The substrates were heated to 400° C. in a humidified $O_2$ atmosphere at a rate of 10° C./min (the humidification of $O_2$ was effected by bubbling in deionized water at 2.0 L/min) and the substrates were held at 400° C. for 60 min. The process atmosphere was changed to dry $O_2$; thereafter, the power to the electric furnace was switched off to cool the substrates. By this step of firing at the lower temperature, a second layer of polycrystalline ferroelectric film having a comparatively low density and a low refractive index but whose surface was optically smooth was formed on the first layer.

The thin $LiNbO_3$ film thus prepared was comparable to the single crystal grade in terms of the refractive index and the optical transmittance in the visible range.

For comparison, a single-layer thin $LiNbO_3$ film was formed by conducting firing only at a temperature of 400° C.; this film had an optically smooth and transparent surface; however, in the presence of fine pores with diameters on the order of nanometers, the film did not have a very high density, nor was its refractive index comparable to the single-crystal grade. Another single-layer thin $LiNbO_3$ film was formed by conducting firing only at a temperature of 700° C.; this film had high density and its refractive index was also comparable to the single-crystal grade; however, due to its coarse crystal grain structure, the surface of the film was not optically smooth and its transparency was not comparable to the single-crystal grade.

EXAMPLE 2

This example refers to the preparation of a multilayered thin ferroelectric film that was made of $PbTiO_3$ (PT).

First, $Ti(O-i-C_3H_7)_4$ was dissolved in ROH (R=$CH_3OCH_2CH_2$—) at room temperature to prepare a 0.2M solution and, thereafter, the reaction of exchange between $i-C_3H_7OH$ and ROH was carried out by distillation at 120° C. for 2 h. Then, $Pb(CH_3COO)_2$ was dissolved in the same solution, followed by adjustment to 0.2M. By subsequent distillation at 120° C. for 24 h, a metal complex $PbTiO_2(OR)_2$ was formed and the by-product ester ($CH_3COOR$) was removed. Thereafter, the concentration of the solution under vacuum and the addition of a solvent were repeated to achieve 90% solvent replacement, whereby all the ester in the solvent was removed. The resulting solution was adjusted to 0.2M and, thereafter, a solution of $H_2O:HNO_3$ in ROH was added in such an amount that the ratio of $Pb:H_2O:HNO_3$ would be 1:0.5:0.1. By subsequent refluxing at 60° C. for 60 min, the metal alkoxide was partly hydrolyzed. Thereafter, the solution was concentrated under vacuum to prepare a precursor solution having a final concentration of 0.4M in terms of Pb. All of the steps up to this stage were performed in a $N_2$ atmosphere.

The thus prepared solution precursory of PT was spin coated (2,500 rpm) on a cleaned $SiO_2$ layer carrying silicon (100) or glass substrate in a $N_2$ atmosphere at room temperature. Following the spin coating, the substrate was exposed to an $O_2$ atmosphere and the applied thin coat was thermally decomposed at 350° C. for 5 min. The process was repeated four times and the substrate was heated at 650° C. for 30 min, whereby the thin coat was crystallized to form a single layer of perovskite. Thus, a first layer of polycrystalline ferroelectric film having high density and a refractive index of the single-crystal grade was formed on the substrate.

In the next step, a solution for the second layer of polycrystalline ferroelectric film was applied by spin coating that was performed in the same manner as described above. The asperities in the surface of the first layer of polycrystalline ferroelectric film that were due to the coarse crystal grains formed by the growth of secondary crystal grains were leveled out by spin coating to produce a very smooth surface. The substrate was held at 500° C. in an $O_2$ atmosphere for 30 min. By this step of firing at the lower temperature, a second layer of polycrystalline ferroelectric film having a comparatively low density and a low refractive index but whose surface was optically smooth was formed on the first layer. This second layer had a single-crystal orientation.

EXAMPLE 3

Using $Pb(CH_3COO)_2$, $Zr(O-i-C_3H_7)_4$ and $Ti(O-i-C_3H_7)_4$, two precursor solutions, one for PT and the other for $Pb(Zr_{0.53}Ti_{0.47})O_3$ (PZT), were prepared in accordance with methods that were substantially the same as those described in Examples 1 and 2. A $SiO_2$ layer carrying silicon (111) or glass substrate that had been cleaned by the same method as in Examples 1 and 2 was spin coated (2,500 rpm) with the precursor solution for PZT at room temperature in a $N_2$ atmosphere. Following the spin coating, the substrate was exposed to an $O_2$ atmosphere and the applied thin coat was thermally decomposed at 350° C. for 5 min. The process was repeated four times and the substrate was heated at 650° C. for 30 min, whereby the thin PZT coat was crystallized to form a single layer of perovskite.

In the next step, the precursor solution for PT that was prepared by the same method as in Example 2 was spin coated on the PZT film; the substrate was then exposed to an $O_2$ atmosphere, in which the applied thin coat was thermally decomposed at 350° C. for 5 min. Subsequently, the substrate was heated at 500° C. for 30 min, whereby the thin PT coat was crystallized to form a single layer of perovskite.

The PZT layer formed by firing at the higher temperature had a refractive index as high as 2.43, whereas the PT layer, which would exhibit a refractive index of about 2.60 if fired at high temperature, has a refractive index of 2.42 and an optically smooth surface on account of the firing that was conducted at the lower temperature. Therefore, the dual film comprising PT and PZT layers had a uniform refractive index distribution.

The multilayered thin ferroelectric film of the present invention has an optically smooth and transparent surface and it also has a comparatively high refractive index; therefore, it is suitable for use in electrooptic or acoustooptic devices that adopt an optical waveguide structure. Besides the optical smoothness, the surface of the film has no pinholes and, hence, the current leakage in the film is small and its dielectric breakdown voltage is high enough to make the film suitable for use in a nonvolatile memory device. According to the process of the present invention, a multilayered thin ferroelectric film that has an optically smooth and transparent surface and which also has a comparatively high refractive index can be produced by performing at more than one stage the hydrolysis of a solution of an organometallic compound. The process has the following additional advantages: it achieves precise control over the chemical composition of the multilayered thin ferroelectric film to be formed; it insures uniformity at the molecular level; it can be implemented at lower temperatures; it can produce films of large area; and it can be implemented at low equipment cost.

What is claimed is:

1. A multilayered thin ferroelectric film, comprising:
a substrate;
a first layer of polycrystalline ferroelectric film of a hydrolyzed organometallic compound that is formed on said substrate and has a refractive index of a single-crystal grade but whose surface is not optically smooth; and
a second layer of polycrystalline ferroelectric film of a hydrolyzed organometallic compound that is formed on said first layer of polycrystalline ferroelectric film, and has a lower refractive index than a single crystal but has an optically smooth surface, the second layer having a density lower than the density of the first layer.

2. The multilayered thin ferroelectric film according to claim 1, wherein said substrate is made of a material that has no epitaxial property with respect to said thin ferroelectric film.

3. A multilayered thin ferroelectric film according to claim 1, wherein said organometallic compound is selected from the group consisting of metal alkoxides and metal salts.

4. A multilayered thin ferroelectric film according to claim 3, wherein the metal of said metal alkoxides and metal salts is Li, K, Nb, Ta, Bi, Ba, St, Pb, La, or Ti.

* * * * *

UNITED STATES PATENT AND TRADEMARK OFFICE
CERTIFICATE OF CORRECTION

PATENT NO. : 5,558,946
DATED : September 24, 1996
INVENTOR(S) : Keiichi NISHIMOTO It is certified that error appears in the above-indentified patent and that said Letters Patent is hereby corrected as shown below:

Claim 4, Column 8, line 12, "St," should read --Sr,--.

Signed and Sealed this

Eleventh Day of February, 1997

Attest:

BRUCE LEHMAN

Attesting Officer

Commissioner of Patents and Trademarks